United States Patent [19]
Gale

[11] Patent Number: 5,382,946
[45] Date of Patent: Jan. 17, 1995

[54] METHOD AND APPARATUS FOR DETECTING LEAKAGE RESISTANCE IN AN ELECTRIC VEHICLE

[75] Inventor: Allan R. Gale, Allen Park, Mich.

[73] Assignee: Ford Motor Company, Dearborn, Mich.

[21] Appl. No.: 1,957

[22] Filed: Jan. 8, 1993

[51] Int. Cl.⁶ ............................................. G08B 21/00
[52] U.S. Cl. .................................. 340/650; 324/510; 361/42
[58] Field of Search ................... 340/650, 651; 361/42, 361/45; 324/509, 510

[56] References Cited

U.S. PATENT DOCUMENTS

| | | | |
|---|---|---|---|
| 2,991,397 | 7/1961 | Place . | |
| 3,066,284 | 11/1962 | McKinley et al. | 340/651 |
| 3,696,367 | 10/1972 | Inamdar | 340/255 |
| 3,788,646 | 1/1974 | Naito et al. | 340/255 |
| 3,975,663 | 8/1976 | Moorey | 340/650 X |
| 4,451,823 | 5/1984 | Penn et al. | 361/85 X |
| 4,638,245 | 1/1987 | MacPhee et al. . | |

FOREIGN PATENT DOCUMENTS 0215620 3/1987 European Pat. Off. .
0493271 7/1992 European Pat. Off. .
9119205 12/1991 WIPO .

Primary Examiner—Jeffery A. Hofsass
Attorney, Agent, or Firm—Roger L. May; Paul K. Godwin, Jr.

[57] ABSTRACT

Provided is a method and circuit for measuring the leakage path resistance in an electric vehicle having an isolated high voltage traction battery and an auxiliary battery grounded to the vehicle. The circuit operates by periodically applying a selected excitation signal and comparing the voltage induced on an energy storage element by the excitation signal to a selected reference voltage during a selected time period. An alternate embodiment of the present invention provides a circuit which operates by applying a periodic excitation signal and comparing the phase shift of the voltage induced on an energy storage element to the phase shift of a signal derived from the excitation signal.

13 Claims, 4 Drawing Sheets

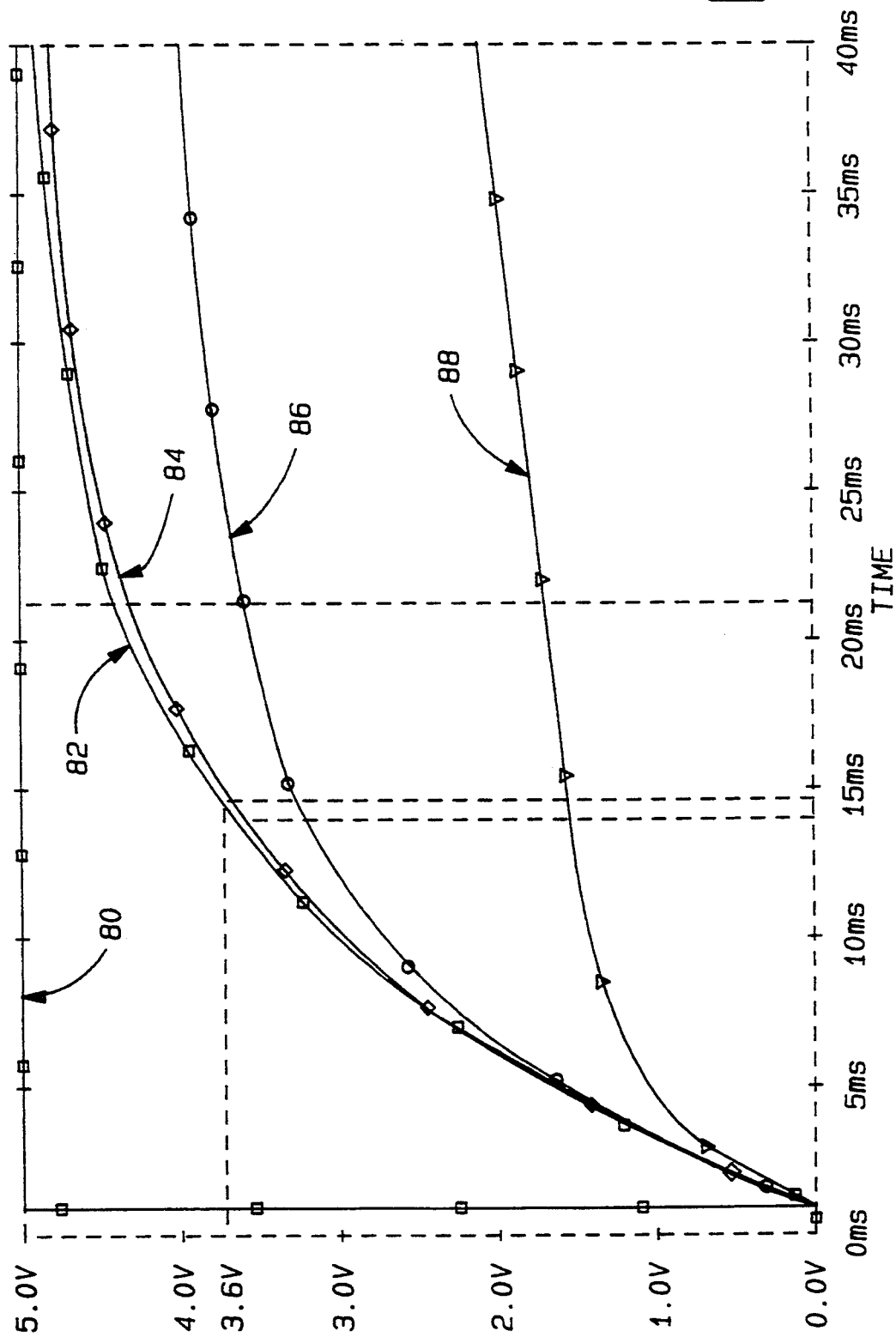

1

METHOD AND APPARATUS FOR DETECTING LEAKAGE RESISTANCE IN AN ELECTRIC VEHICLE

TECHNICAL FIELD

The present invention relates to leakage path detection circuits, and more particularly to a method and apparatus for determining the resistance of a leakage path in an electric vehicle having an isolated high voltage traction battery and an auxiliary battery grounded to the vehicle.

BACKGROUND OF THE INVENTION

Conventional electric vehicles are known to those skilled in the art to be equipped with a high voltage traction battery for use as a primary source of power and an auxiliary battery for use in powering various electrical components. For obvious design reasons, the high voltage traction battery is typically isolated from the vehicle chassis to prevent the formation of a current path when a person concurrently contacts the vehicle and one of the traction battery terminals. Even in this arrangement, however, it is still possible to cause a short circuit between the traction battery and the body of the vehicle due to the potential leakage of electrolyte from the battery or for other reasons. If such leakage does occur, a resistive path is developed through which leakage current may flow.

Previous work in detecting resistive paths of the type referenced above have involved deliberately providing a return path for current to flow through the resistive path into the vehicle chassis and back to the traction battery. Unfortunately, these designs create the very resistance path that the test is intended to detect. Thus, if a person concurrently touches the vehicle and the traction battery during the test, a resistive path may develop, and result in the unwanted flow of current. The other disadvantage known to those skilled in the art is that the mechanical contacts historically used in prior art leakage path detection devices become dirty and require regular servicing.

See, for example, U.S. Pat. No. 3,696,367 issued to Inamdar on Oct. 3, 1972. Inamdar discloses a ground fault detection circuit for use with dual voltage battery systems, comprising first and second ground connected circuits which are alternatively energized depending on the location of a ground fault in any one of three lines connected to the system. Those skilled in the art will recognize that Inamdar physically connects the high voltage and low voltage batteries used by the electric vehicle.

See, also, U.S. Pat. No. 3,786,466 issued to Naito, et al., on Jan. 15, 1974. Naito discloses a leakage detecting circuit for detecting leakage from a source of power, such as a battery, to a source of reference potential. The circuit comprises a pair of voltage detecting circuits respectively connected to the positive and negative terminals of the battery to ground through first and second switching means. As discloses by Naito, the battery is insulated from ground so that if a leakage path exists between the battery and ground, an electrical circuit is closed which includes a voltage detection device and one of the switching means. Conventional electrical leakage detecting devices such as those referenced above have proven inoperable due to their inability to detect leakage current without creating the very leakage situation for which they are designed to detect.

SUMMARY OF THE INVENTION

It is an object of the present invention to overcome the problems of the prior art leakage detection devices by providing a method and apparatus for determining the resistance of a leakage path by relying on the known operating characteristics of an RC circuit. As disclosed herein, the circuit arrangement of the present invention relies on attempting to store energy in a plurality of energy storage devices which are designed to resist breakdown under high differential voltages.

In carrying out the above object, the leakage detection circuit of the present invention comprises excitation means for periodically applying a selected signal to the circuit as well as first and second energy storage means. The first energy storage means has an input terminal and a grounded output terminal. The second energy storage means similarly has an input terminal and an output terminal in electrical contact with the traction battery. There is further provided comparator means for comparing the voltage induced on the first energy storage means from the excitation means to a selected DC reference voltage during a selected time period. The comparator means further acts to generate an output signal indicating whether the induced voltage exceeds a selected voltage. Protect means is also provided for protecting the comparator means from unwanted voltage spikes.

The disclosed method and apparatus for detecting leakage current is also applicable for use in cooperation with an AC power source. In such case, the comparator means acts to compare the induced voltage on the second energy storage means to an output signal derived from the excitation signal and to generate a second output signal which indicates the phase shift between the induced voltage and the derived signal during a selected time period. In either case, the signal is used to determine the resistance of the leakage path. As more fully illustrated below, the leakage path detection circuit and method of the present invention is simple in operation and avoids the prior art dilemma of creating the very leakage path it is intended to detect.

Accordingly, a general object of the present invention is the provision of a method and apparatus for detecting leakage path resistance through reliance on the known operating characteristics of an RC circuit in combination with comparator means to compare the induced voltage to a signal derived from an excitation signal and generate an output signal indicating the leakage path resistance during a selected time period.

BRIEF DESCRIPTION OF THE DRAWINGS

FIG. 6 is a graphical schematic of the voltage induced on the first energy storage means of the present invention through application of a stepped voltage over time.

DESCRIPTION OF THE PREFERRED EMBODIMENT

Figure 1:
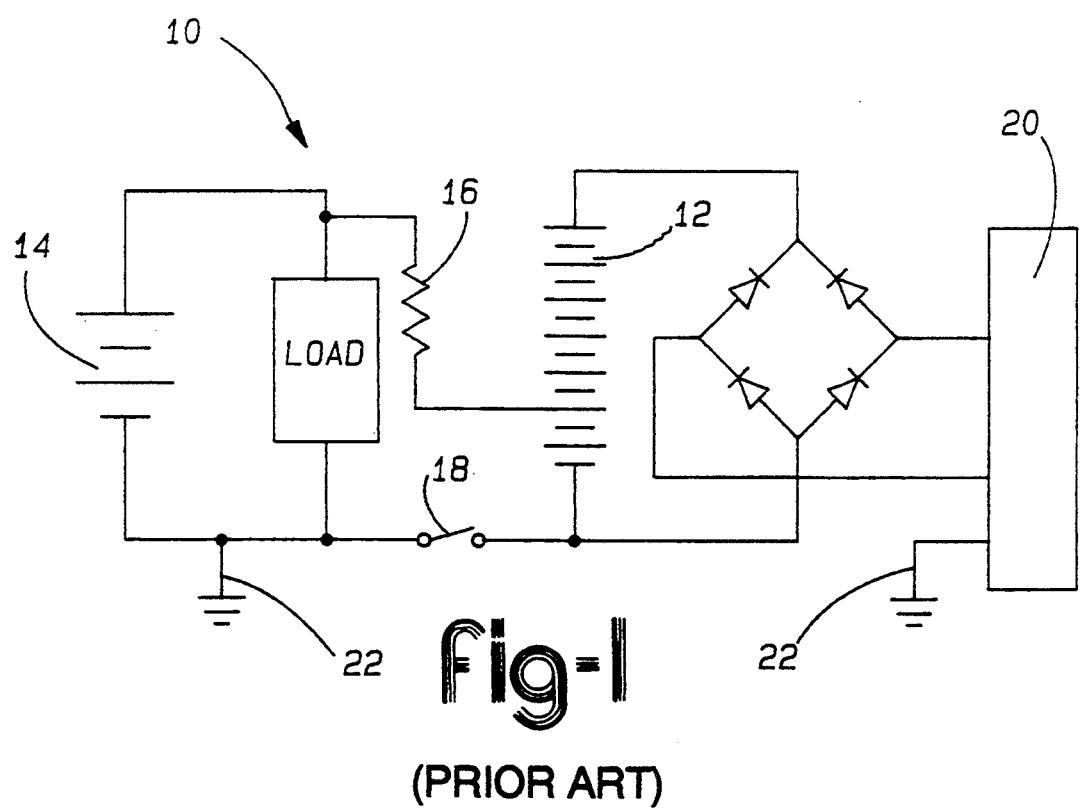
FIG. 1 is a schematic circuit diagram of a prior art leakage detection system.

With reference to FIG. 1 of the drawings, there is shown a prior art leakage path detection circuit indicated generally by reference number 10. Prior art circuit 10 includes an isolated high-voltage traction battery 12 and an auxiliary battery 14. As shown in FIG. 1, a leakage path is depicted by reference numeral 16 through use of a mechanical contact 18. Typically, auxiliary battery 14 is grounded along with the AC line 20 to the vehicle chassis 22. As referenced above, prior art system 10, by design, creates the very resistance path it is intended to detect. Thus, a person coming in contact with traction battery 12 concurrently with the vehicle chassis 22 may suffer a shock.

Figure 2:
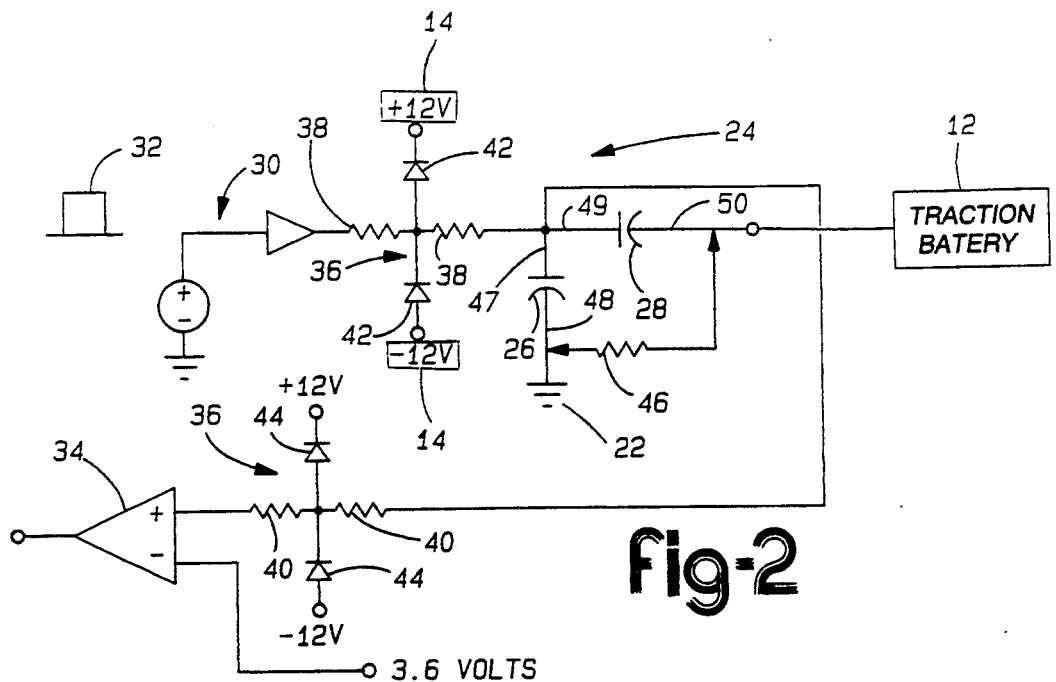
FIG. 2 is a schematic circuit diagram of one of the leakage path current detection circuit of the present invention.

Referring now to FIG. 2, the leakage path detection circuit of the present invention is indicated generally by reference numeral 24. Detection circuit 24 includes a pair of first and second energy storage devices such as capacitors 26 and 28. Capacitor 26 is provided with an input terminal and a grounded output terminal. Similarly, capacitor 28 is provided with an input terminal and an output terminal in electrical contact with traction battery 12. There is further provided buffered excitation means 30 for periodically applying a selected signal 32 to the detection circuit 24. In a preferred embodiment, excitation means 30 may be a switch capable of alternately applying an excitation signal 32 and grounding the circuit 24. Comparator means such as operational amplifier comparator 34 is also provided in electrical contact with capacitors 26 and 28 for comparing the voltage induced on capacitor 26 to a DC reference voltage during a predetermined time period. Again, in a preferred embodiment, the DC reference voltage may be derived from the level of the excitation signal 32 generated by excitation means 30. This signal is compared to the voltage induced on capacitor 26 for a predetermined time period which is preferably, but not necessarily, on the order of 20 ms. Comparator 34 thereafter generates an output signal indicating whether the induced voltage exceeds the selected voltage.

Finally, protect means generally designated by reference numeral 36 are provided in electrical contact with excitation means 30, comparator means 34 and the respective input terminals of capacitors 26 and 28 for protecting comparator 34 and excitation means 30 from voltage spikes. In the circuit design depicted in FIG. 2, the output signal provided by comparator 34 is used to determine the resistance of the leakage path.

Still referring to FIG. 2, protect means 36 are shown to include, for example, pairs of resistors 38 and 40 and pairs of clamping diodes 42 and 44 for dissipating unwanted voltage spikes.

Significantly, the leakage path detection circuit referenced above requires no moving mechanical contacts. Instead, the circuit relies on attempting to store energy in capacitor 26 which is designed to resist breakdown under high differential voltages. In operation, if a resistive path 46 exists anywhere between traction battery 12 and the auxiliary battery 14, capacitor 28 will be capable of storing energy according to the known equation $Q=CV$. Those skilled in the art will recognize that the energy stored in capacitor 28 will depend on the voltage across capacitor 26 and the amount of resistance in the resistive path 46 between traction battery 12 and the auxiliary battery 14 or vehicle chassis 22.

The circuit of FIG. 2 operates by periodically applying a selected excitation signal such as pulse 32 to the circuit. If there is no resistive path, the voltage across capacitor 26 will change according to the equation:

$$V_c(t) = a(1 - e^{-\frac{(t-t_0)}{R_1C_1}})$$

for time $t_0 < t < t_1$, where $t_0$ is the instant of excitation, $t_1$ is the time of the trailing edge of pulse 32, a is the amplitude of the excitation, $R_1$ is the sum of the values of resistors 38 and $C_1$ is the value of capacitor 26.

Figure 3:
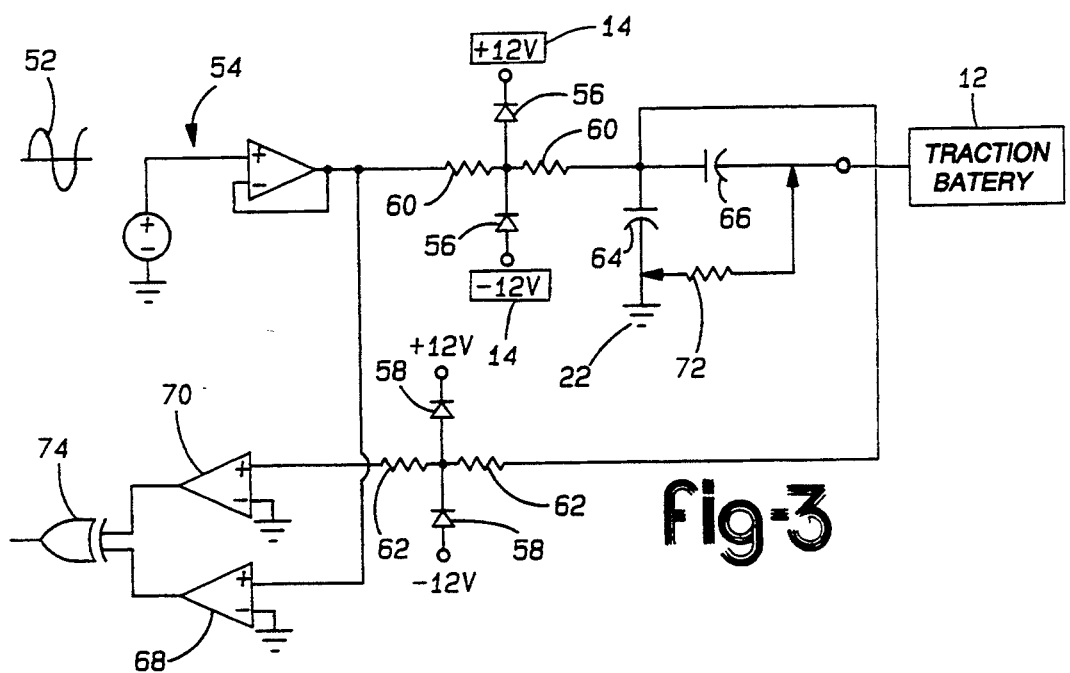
FIG. 3 is a schematic circuit diagram of an alternate embodiment of the present invention.
Figure 4:
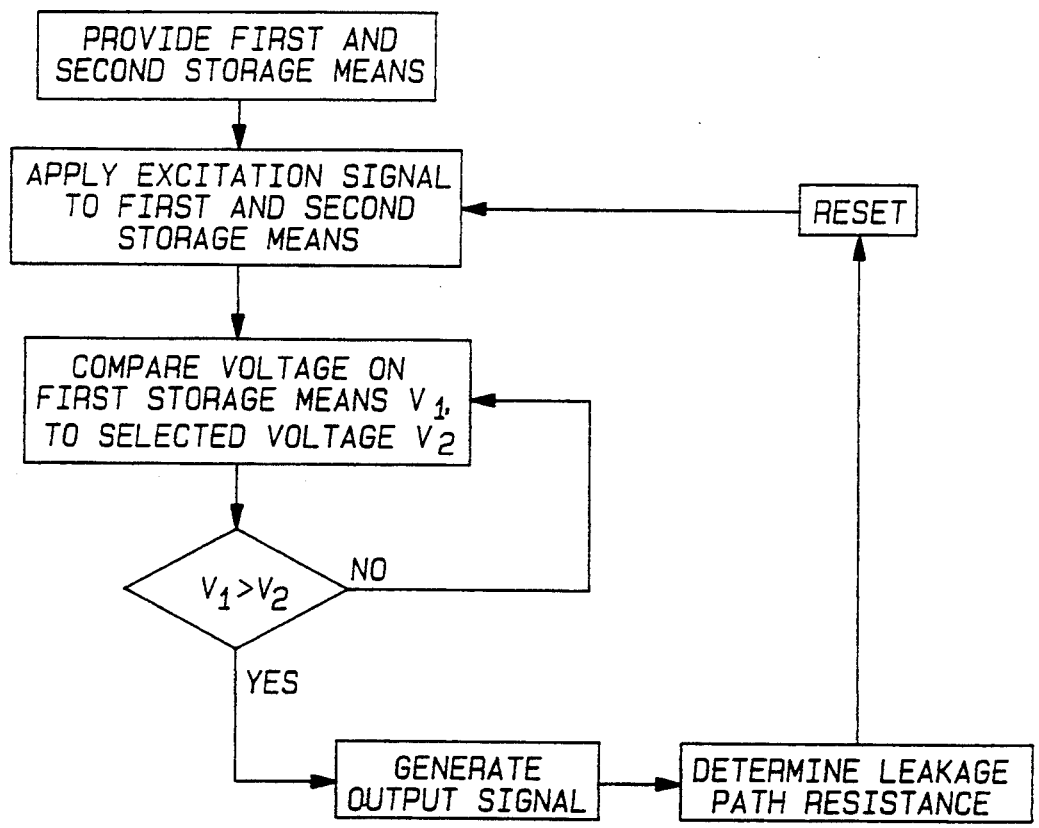
FIG. 4 is a block diagram of the method steps of one embodiment of the present invention.
Figure 5:
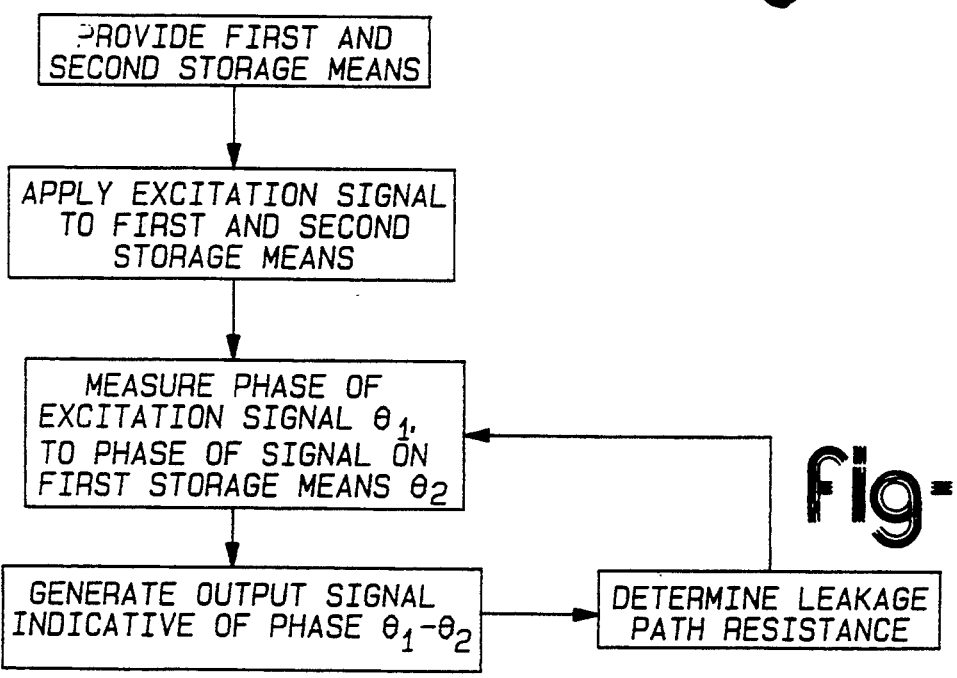
FIG. 5 is a block diagram of the method steps of an alternative embodiment of the present invention.

If a resistive path does exist, the voltage across capacitor 26 will be changed more slowly due to the energy absorbing capacity of capacitor 28. In a DC design, comparator 34 thus compares the voltage induced on capacitor 26 to a selected DC reference voltage during a selected time period and generates an output signal indicating whether the induced voltage exceeds the selected voltage. In contrast, in an AC design, a comparator compares the voltage induced on a capacitor to a signal derived from a periodic excitation signal and generates an output signal indicating the phase shift between the induced voltage and the derived signal during a predetermined time period. Like the DC design above, in the preferred embodiment, this time period is preferably, but not necessarily, on the order of 20 ms. See, for example, the alternative embodiment of a leakage path detection circuit shown in FIG. 3.

A periodic signal such as sine wave 52 is generated by buffered excitation means 54. Diode pairs 56 and 58, resistor pairs 60 and 62, and capacitors 64 and 66 are configured as in the embodiment of the invention presented in FIG. 2. The buffered excitation signal is fed to the non-inverting input of comparator 68 and the voltage across capacitor 64 is coupled to the non-inverting input of comparator 70. As the leakage path resistance 72 varies, the phase difference between these two signals will vary in a predictable manner at the frequency of interest. Considering the angular frequency of excitation to be $\omega$ and considering the phase to be zero, the phase shift between the excitation signal and the voltage across capacitor 64 can be expressed as:

$$\text{Phase Shift} = \Delta G(j\omega)$$

where, $$\Delta G(j\omega) = \Delta \left[ j\omega + \frac{1}{R_2C_2} \right] - $$

$$\Delta \left[ \left( \frac{1}{R_1C_1} + \frac{1}{R_2C_2} + \frac{1}{R_2C_1} \right) j\omega + \frac{1}{R_1R_2C_1C_2} - \omega^2 \right]$$

and where $R_1$ represents the sum of the values of resistors 60, $R_2$ represents the resistance of the resistive path, $C_1$ represents the value of the capacitor 64 and $C_2$ represents the value of capacitor 66.

Comparators 70 and 68 compare each of these signals to ground. The compared results are fed to exclusive OR (EXOR) gate 74 which yields a train of pulses whose width is proportional to the phase difference between the two signals. Thus, the actual phase difference can be ascertained by measuring the width of these pulses directly by analog or digital circuitry or alternatively, by a circuit which low pass filters the pulses to generate a D.C. level proportional to phase shift. The deviation of this phase shift from a phase indicative of no leakage or acceptable leakage can thus be detected, and can be used to determine the leakage resistance.

OPERATION

With reference to FIGS. 2-5, the method steps of the present invention will be described in further detail. These steps include the provision of first and second energy storage means. The first energy storage means includes an input terminal 47 and a grounded output terminal 48. The second energy storage means includes an input terminal 49 and an output terminal 50 in electrical contact with the traction battery 12. By periodically applying a selected excitation signal to the first and second energy storage means such as capacitors 26 and 28, a voltage is induced on capacitor 26. This induced voltage is thereafter compared (in a DC design) to a DC reference voltage and an output signal is thereafter generated indicating whether the induced voltage exceeds the reference voltage during a predetermined time period. This output signal is used to determine the resistance of the leakage path.

In an AC design, the voltage induced on capacitor 64 is compared to a signal derived from the excitation signal and an output signal is thereafter generated indicating the phase shift between the induced voltage and the derived signal during a selected time period.

FIG. 6 shows four time plots 82, 84, 86 and 88 of the circuit of FIG. 2 where the leakage path resistance is set to infinity, 380k$\Omega$, 38k$\Omega$, and 3.8k$\Omega$, respectively. $R_1$ is set to 10k$\Omega$, $C_1$ is set to 1 $\mu$F and $C_2$ is set to 10 $\mu$F. The input voltage is stepped from zero volts to five volts at t=1 msec as shown in plot 80. For the electric vehicle, ten milliamps has been generally recognized by those skilled in the art to be the maximum amount of leakage current. This current correlates to a resistive path of approximately 38K ohms. As can be seen 20 milliseconds after the step voltage is applied, the Spice ® simulation shows capacitor 28 to have approximately 4.32 volts if no resistive path exists and approximately 3.6 volts in the 38K path exists. This difference can be detected and used for the leakage detection as referenced above.

It should be noted that in the particular application described herein, 3.6 volts has been selected as the threshold voltage for comparison. Those skilled in the art, however, will recognize that any voltage may be selected in accordance with the amplitude of the excitation voltage, the objectives of the leakage path to be detected and the circuit used therein.

I claim:

1. A leakage path detection circuit for detecting leakage current in an electric vehicle having an isolated high voltage traction battery and an auxiliary battery grounded to the vehicle, the circuit comprising:

excitation means for periodically applying an excitation signal to the circuit;

first energy storage means having an input terminal in electrical contact with said excitation means and a grounded output terminal for storing a voltage induced thereon by said excitation means;

second energy storage means having an input terminal in electrical contact with said excitation means and an output terminal in electrical contact with the traction battery for storing a voltage induced thereon by said excitation means;

comparator means in electrical contact with said first and second energy storage means for comparing said induced voltage to a DC reference voltage during a predetermined time period and generating an output signal indicating whether said induced voltage exceeds said reference voltage; and protect means in electrical contact with said excitation means, comparator means and the respective input terminals of said first and second energy storage means for protecting said comparator means from voltage spikes, wherein said output signal is used to determine the resistance of the leakage path.

2. A circuit as in claim 1, wherein said first energy storage means comprises a capacitor.

3. A circuit as in claim 1, wherein said second energy storage means comprises a capacitor.

4. A circuit as in claim 1, wherein said predetermined time period is 20 ms.

5. A circuit as in claim 1, wherein said selected DC voltage is a reference voltage derived from the level of said excitation signal.

6. A circuit as in claim 1, wherein said excitation means is a switch capable of alternately applying an excitation signal and grounding the circuit.

7. A leakage path detection circuit for detecting leakage current in an electric vehicle having an isolated high voltage traction battery and an auxiliary battery grounded to the vehicle, the circuit comprising:

excitation means for periodically applying a selected signal to the circuit;

first energy storage means having an input terminal in electrical contact with said excitation means and a grounded output terminal for storing a voltage induced thereon by said excitation means;

second energy storage means having an input terminal in electrical contact with said excitation means and an output terminal in electrical contact with the traction battery for storing a voltage induced thereon by said excitation means;

comparator means in electrical contact with said first and second energy storage means for comparing said induced voltage to a signal derived from said excitation signal and generating an output signal indicating the phase shift between said induced voltage and said derived signal during a predetermined time period; and protect means in electrical contact with said excitation means, comparator means and the respective input terminals of said first and second energy storage means for protecting said comparator means from voltage spikes, wherein said output signal is used to determine the resistance of the leakage path.

8. A circuit as in claim 7, wherein said first energy storage means comprises a capacitor.

9. A circuit as in claim 7, wherein said second energy storage means comprises a capacitor.

10. A circuit as in claim 7, wherein said predetermined time period is 20 ms.

11. A circuit as in claim 7, wherein said excitation means is a switch capable of alternately applying an excitation signal and grounding the circuit.

12. A method of detecting leakage path current in an electric vehicle having an isolated high voltage traction battery and an auxiliary battery grounded to the vehicle, the method comprising the steps of:

providing first energy storage means having an input terminal in electrical contact with said excitation means and a grounded output terminal;

providing second energy storage means having an input terminal in electrical contact with said excitation means and an output terminal in electrical contact with the traction battery;

periodically including a voltage on said first energy storage means by the application of an excitation signal;

comparing the voltage induced on said first energy storage means to a DC reference voltage and generating an output signal indicating whether said induced voltage exceeds said reference voltage during a predetermined time period, wherein said output signal may be used to determine the resistance of the leakage path.

13. A method of detecting leakage path current in an electric vehicle having an isolated high voltage traction battery and an auxiliary battery grounded to the vehicle, the method comprising the steps of:

providing first energy storage means having an input terminal in electrical contact with said excitation means and a grounded output terminal;

providing second energy storage means having an input terminal in electrical contact with said excitation means and an output terminal in electrical contact with the traction battery;

inducing a periodic voltage on said first energy storage means by the application of an excitation signal;

generating an output signal corresponding to the phase shift between the voltage induced on said first energy storage means and a signal derived from said excitation signal during a predetermined time period, wherein said output signal may be used to determine the resistance of the leakage path.

\* \* \* \* \*